United States Patent [19]

Matsuoka

[11] Patent Number: 5,084,403
[45] Date of Patent: Jan. 28, 1992

[54] METHOD OF MANUFACTURING A SEMICONDUCTOR DEVICE INCLUDING CONNECTING A MONOCRYSTALLINE ALUMINUM WIRE

[75] Inventor: Fumitomo Matsuoka, Kawasaki, Japan

[73] Assignee: Kabushiki Kaisha Toshiba, Kawasaki, Japan

[21] Appl. No.: 668,830

[22] Filed: Mar. 13, 1991

[30] Foreign Application Priority Data

Mar. 16, 1990 [JP] Japan .................................. 2-66684

[51] Int. Cl.⁵ .............................................. H01L 21/20
[52] U.S. Cl. ........................................ 437/40; 437/41; 437/192; 437/194
[58] Field of Search ................ 437/40, 41, 192, 194

[56] References Cited

U.S. PATENT DOCUMENTS

| | | | |
|---|---|---|---|
| 4,960,732 | 10/1990 | Dixit et al. | 437/192 |
| 4,961,822 | 10/1990 | Liao et al. | 437/192 |
| 4,996,133 | 2/1991 | Brighton et al. | 437/192 |

FOREIGN PATENT DOCUMENTS

| | | | |
|---|---|---|---|
| 60-157237 | 8/1985 | Japan | 437/192 |
| 1-030219 | 2/1989 | Japan | 437/192 |
| 1-037050 | 2/1989 | Japan . | |
| 1-037051 | 2/1989 | Japan . | |
| 1-049225 | 2/1989 | Japan . | |

*Primary Examiner*—Brian E. Hearn
*Assistant Examiner*—Laura M. Holtzman
*Attorney, Agent, or Firm*—Finnegan, Henderson, Farabow, Garrett and Dunner

[57] ABSTRACT

A method of forming a semiconductor device. An insulating film is formed on a semiconductor region including an impurity. A first contact hole which reaches the semiconductor region is formed in the insulating film. A monocrystalline semiconductor film is formed on the portion of the semiconductor region which is exposed by the first contact hole, and on the insulating film. A monocrystalline aluminum film is formed on the monocrystalline semiconductor film. The portion of the aluminum film in the first contact hole is removed, thereby forming in the aluminum film a second contact hole, which overlaps the first contact hole. Thereafter, a tungsten film is formed in the second contact hole.

8 Claims, 3 Drawing Sheets

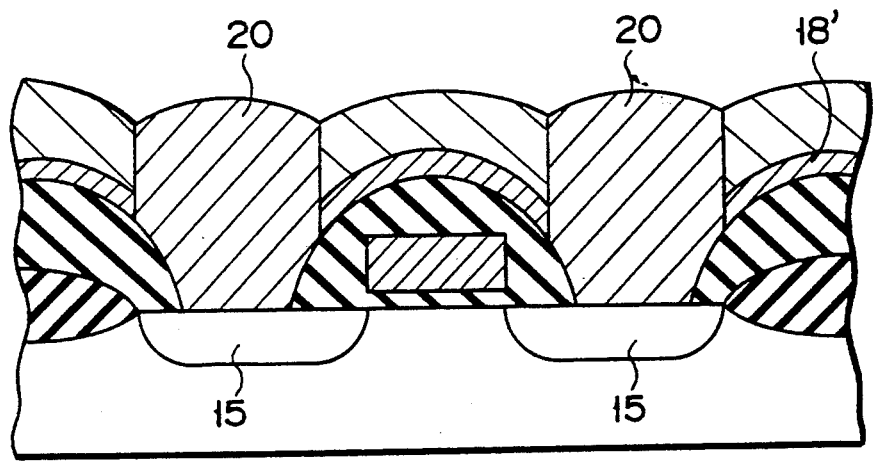
F I G. 2D
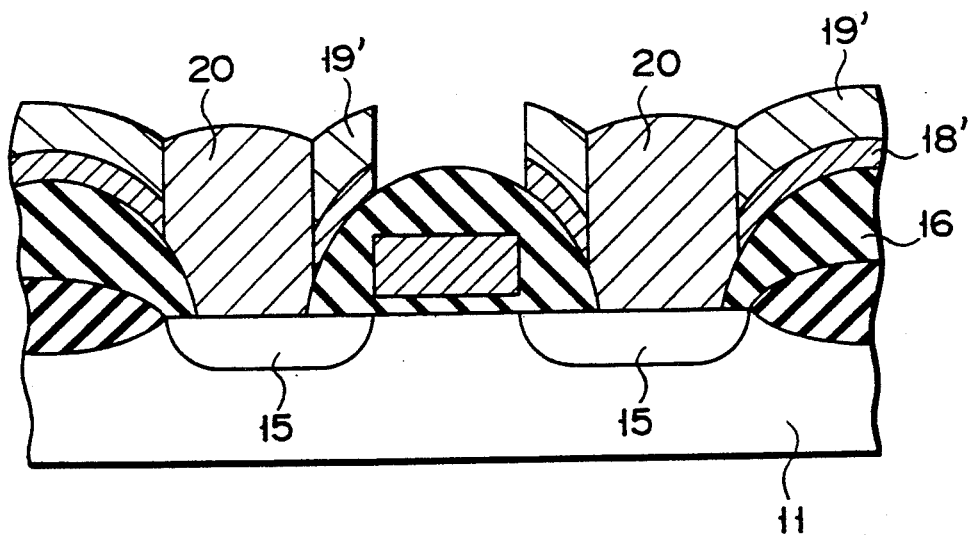
F I G. 2E

METHOD OF MANUFACTURING A SEMICONDUCTOR DEVICE INCLUDING CONNECTING A MONOCRYSTALLINE ALUMINUM WIRE

BACKGROUND OF THE INVENTION

1. Field of the Invention

This invention relates to an improved method of connecting a monocrystallized aluminum wire or an aluminum wire including grain boundaries with a diffusion layer formed in a semiconductor substrate.

2. Description of the Related Art

FIGS. 1A to C show a conventional method of connecting polycrystalline aluminum wires formed by an ordinary sputter method with diffusion layers formed in a semiconductor substrate.

First, as is shown in FIG. 1A, element isolating regions 22 are formed on a p-type semiconductor substrate by a selective oxidation method. Then, a 10nm thick gate oxide film 23 is formed by thermal oxidation method on an element region isolated by the element isolating regions 22. Thereafter, polycrystalline silicon doped with, for example, an n-type impurity is deposited on the substrate to a thickness of about 200 to 300 nm. The polycrystalline silicon is etched by photoetching method, thereby forming a gate electrode 24 having a predetermined configuration. Then, using the gate electrode 24 as a mask, arsenic (As) which having an acceleration energy of, for example, 50 keV, is injected into the semiconductor substrate 21 to a density of about $5 \times 10^{15} cm^{-2}$. As a result, n-type diffusion layers 25 are formed in the semiconductor substrate 21. Since this injection is performed, using the gate electrode 24 as a mask, the diffusion layers 25 are self-aligned. Next, an interlayer insulating film 26—for example, an $SiO_2$ film—is formed on top of the entire substrate 21 to a thickness of about 500 to 1000 nm by chemical vapor phase growth method. And then, predetermined portions of the interlayer insulating film 26 are etched by photoetching method, to form contact holes 27 reaching the n-type diffusion layers 25.

Next, as is shown in FIG. 1B, an aluminum film 28 is deposited by, for example, a sputter process, on top of the entire substrate 21 to a thickness of about 500 mn. As a result, the aluminum film 28 is placed in contact with the diffusion layer 25 via the contact hole 27.

Then, as is shown in FIG. 1C, the aluminum film 28 is etched by a photoetching method, to form aluminum wires 28' having predetermined configurations.

According to the above-described method, since the aluminum film 28 is polycrystalline, electromigration and stressmigration tend to occur.

To overcome this drawback, a high-melting point metal such as tungsten (W), molybdenum (Mo), or copper (Cu) may be used as a wire in place of aluminum. However, a film made of tungsten or molybodenum is disadvantageous in that the resistance is higher than that of an aluminum film, and a film made of copper easily reacts with silicon (Si) and silicon oxide ($SiO_2$).

Accordingly, a method has been devised wherein a monocrystalline aluminum film is formed on a substrate by CVD method. However, using this method, it is necessary to place a seed in the substrate in order to form a monocrystalline aluminum film. Hence, a high quality aluminum film cannot be formed on exposed portions of the diffusion layers and on the insulating film.

SUMMARY OF THE INVENTION

The present invention has been conceived to overcome the above-described drawbacks, and has as its object to provide a method of manufacturing a semiconductor device wherein wires formed on the semiconductor device are made of monocrystalline aluminum, and the contact resistance between the wires and the diffusion layer is low irrespective of the conductivity type of the diffusion layer.

To achieve the above object, the method of manufacturing a semiconductor device according to the present invention comprises the steps of:

forming an insulating film on a semiconductor region including an impurity;

forming in the insulating film a first contact hole, which reaches the semiconductor region;

forming a monocrystalline semiconductor film on the portion of the semiconductor region which is exposed by the first contact hole, and on the insulating film;

forming a monocrystalline aluminum film on the monocrystalline semiconductor film;

removing the portion of the aluminum film in the first contact hole, thereby forming in the aluminum film a second contact hole, which overlaps the first contact hole; and forming a tungsten film in the second contact hole.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIGS. 2A to 2E are sectional views showing a method of manufacturing a semiconductor device according to an embodiment of the present invention.

DETAILED DESCRIPTION OF THE PREFERRED EMBODIMENTS

A method of manufacturing a semiconductor device according to an embodiment of the present invention will now be described, with reference to the accompanying drawings. Specifically, the following description relates to a method of forming a MOSFET.

Figure 1A:
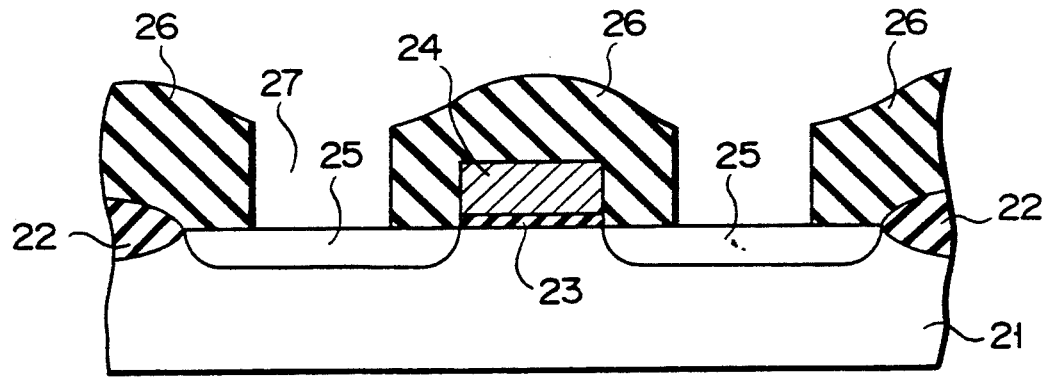
FIGS. 1A to 1C are sectional views showing a conventional method of manufacturing a semiconductor device.
Figure 1B:
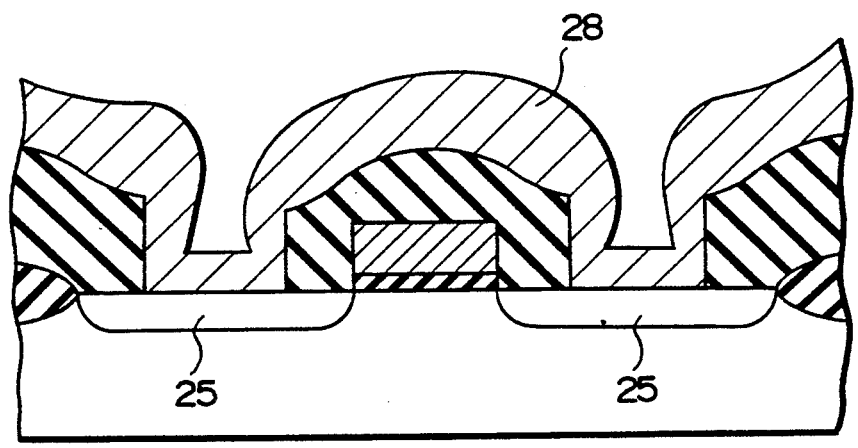
Figure 1C:
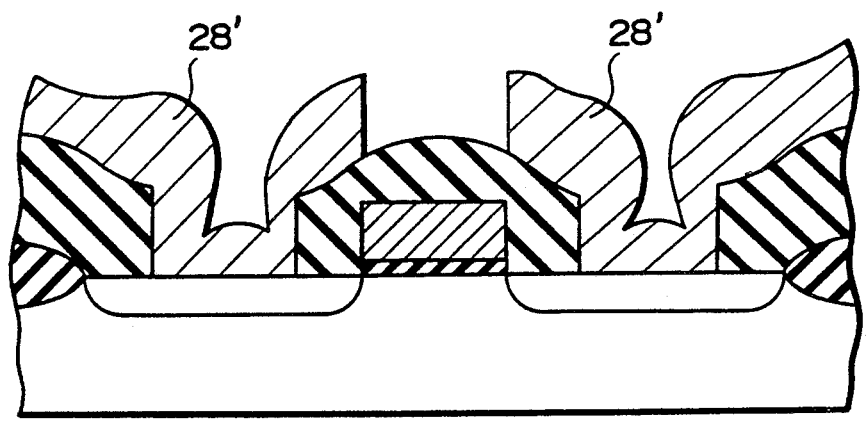
Figure 2A:
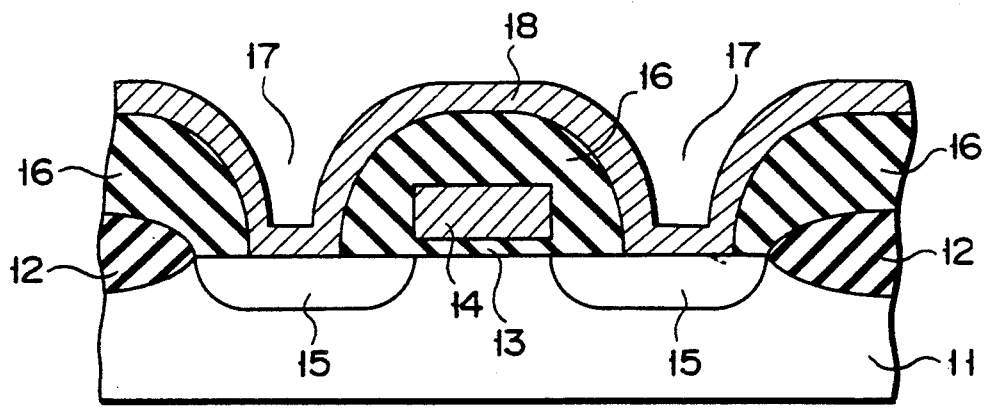

First, as is shown in FIG. 2A, element isolating regions 12 are formed in a p-type semiconductor substrate 11 by selective oxidation method. Then, gate oxide films 13 of a thickness of about 10nm are formed on element regions isolated from one another by the element isolating regions 12. Thereafter, a polycrystalline silicon layer doped with, for example, an n-type impurity is deposited on the entire substrate to a thickness of about 200 to 300 nm. The polycrystalline silicon layer is etched by photoetching method, thereby forming a gate electrode 14 having a predetermined configuration. Then, using the gate electrode 14 as a mask, arsenic (As) having an acceleration energy of, for example, 50 keV is injected into the semiconductor substrate 11 to a density of about $5 \times 10^{15} cm^{-2}$. As a result, n-type source/drain regions 15 are formed in the semiconductor substrate 11. Since this injection is performed, using the gate electrode 14 as a mask, the diffusion layers (source/drain region) 15 are self-aligned. Then, an interlayer insulating film 16—for example, an $SiO_2$ film—is formed on top of the entire substrate 11 to a thickness of about 500 to 1000 nm by chemical vapor phase growth method, and is etched by photoetching method, to form in the interlayer insulating film 16 contact holes 17 reaching the source/drain regions 15. Thereafter, an amorphous silicon film 18 is deposited on top of the entire substrate 11 to a thickness of about 100 nm.

Figure 2B:
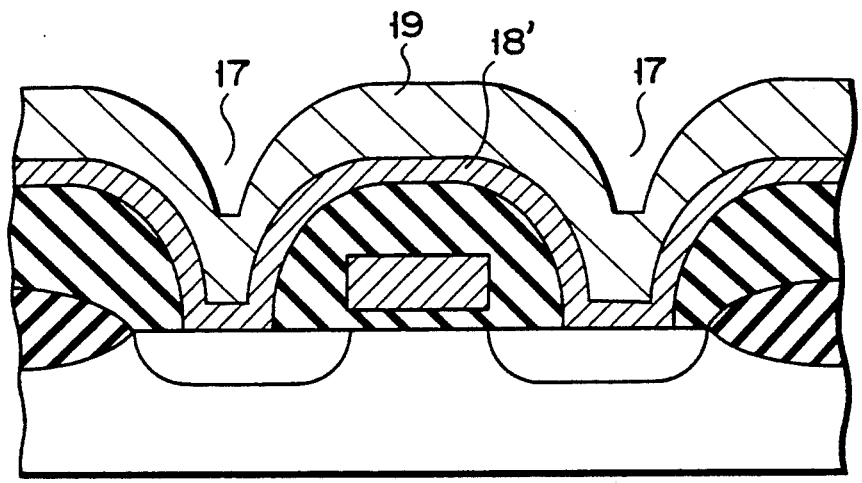

Next, as shown in FIG. 2B, a heat treatment is performed at a temperature of about 500° to 600° C., whereby solid-phase epitaxial growth occurs, using as seeds those portions of the semiconductor substrate (single crystal) which are located under the contact holes 17. As a result, the amorphous silicon film 18 is monocrystallized. Thereafter, a monocrystalline aluminum film 19 is deposited on the monocrystalline silicon film 18' to a thickness of about 500nm.

Figure 2C:
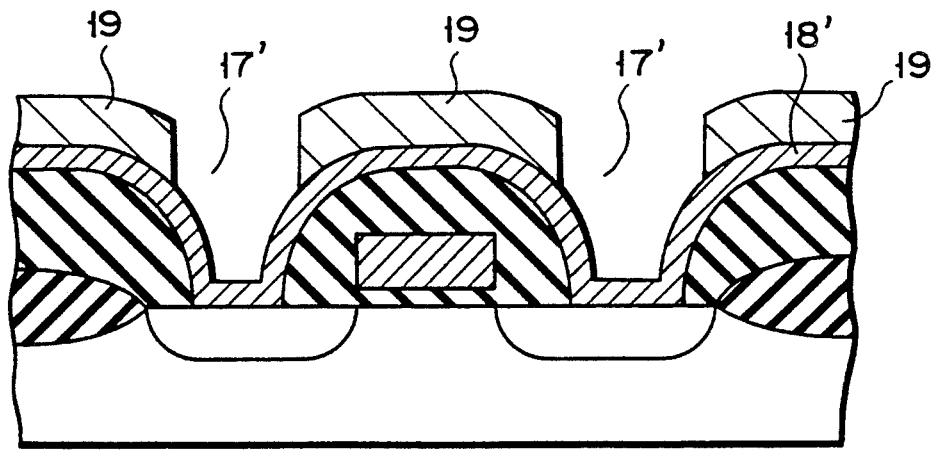

Next, as is shown in FIG. 2C, those portions of the aluminum film 19 in and near the contact holes 17 are removed by a photoetching method, thereby forming contact holes 17' in the aluminum film 19.

Then, as is shown in FIG. 2D, tungsten (W) films 20 are selectively formed on those portions of the semiconductor substrate 11 exposed by the contact holes 17', by means of chemical vapor phase growth method using $WF_6$. Since, at this time, the silicon films 18' forming the bottoms of the contact holes 17 are reduced and removed, the tungsten films 20 come into direct contact with the source/drain regions 15.

Finally, as is shown in FIG. 2E, the aluminum film 19 is etched by photoetching method, thereby forming an aluminum wire 19' of a predetermined configuration.

According to the above manufacturing method, since the aluminum film 19 is formed on the monocrystallized silicon film 18', the wire formed on the entire semiconductor substrate 11 can be made of monocrystalline aluminum of high quality. In addition, since the silicon films 18' formed on the source/drain regions 15 are removed when the tungsten films 20 are formed, the resistance of the contact between the diffusion layer and the wire is low irrespective of the conductivity type of the diffusion layer (source/drain regions). Moreover, since the tungsten films 20 completely fill the contact holes 17', this results in the surface of the semiconductor substrate 11 being entirely flat.

Furthermore, since the silicon film 18' is interposed between the monocrystalline aluminum film 19 and the semiconductor substrate 11, this results in there being no alloy spike such as might otherwise be formed in the semiconductor substrate 11 due to mutual diffusion occurring between the monocrystalline aluminum 19 and the semiconductor substrate 11, if the former were formed directly on the latter.

This invention is not limited to the abovedescribed embodiment but can be variously modified. For example, the monocrystalline silicon film 18' may be obtained by melting the amorphous silicon film 18 and recrystallizing it. The monocrystalline aluminum film 19 may be deposited by ion beam method, or the like, while the tungsten film 20 may be formed by depositing tungsten over the entire substrate, and performing an etch-back process, thereby removing those portions of the tungsten film 20 other than those in the contact holes 17'. The photoetching for removing the portions of the monocrystalline aluminum film 19 formed above the source/drain regions 15 and that for forming the aluminum wire 19' can be performed simultaneously. Moreover, the semiconductor substrate 11 need not be purely monocrystalline; even if the substrate includes a small number of grain boundaries (having a diameter of about 10 $\mu$m), the same effect as in the above embodiment can be obtained. Furthermore, the semiconductor substrate 11 may be of an n-type.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of manufacturing a semiconductor device comprising the steps of:

forming a insulating film on a semiconductor region including an impurity;

forming in the insulating film a first contact hole, which reaches the semiconductor region;

forming a monocrystalline semiconductor film on the portion of the semiconductor region which is exposed by the first contact hole and on the insulating film;

forming a monocrystalline aluminum film on the monocrystalline semiconductor film;

removing the portion of the aluminum film in the first contact hole, thereby forming in the aluminum film a second contact hole, which overlaps the first contact hole; and forming a tungsten film in the second contact hole.

2. A method of manufacturing a semiconductor device according to claim 1, wherein said semiconductor region including a impurity is formed in a monocrystalline semiconductor substrate.

3. A method of manufacturing a semiconductor device according to claim 2, wherein said semiconductor substrate is made of silicon.

4. A method of manufacturing a semiconductor device according to claim 1, wherein said insulating film is made of silicon oxide.

5. A method of manufacturing a semiconductor device according to claim 1, wherein said monocrystalline semiconductor film is formed by forming an amorphous semiconductor film and recrystallizing the same.

6. A method of manufacturing a semiconductor device according to claim 1, wherein the portion of the monocrystalline film in said first contact hole is reduced and removed when said tungsten film is formed.

7. A method of manufacturing a semiconductor device according to claim 1, wherein said semiconductor region including an impurity is a source or drain region of a MOSFET.

8. A method of manufacturing a semiconductor device comprising the steps of:

forming an MOSFET having a source region, a drain region, and a gate electrode in the surface region of a semiconductor substrate;

forming an insulating film on the entire semiconductor substrate;

forming in said insulating film first and second contact holes which reach said source and drain regions, respectively;

forming a monocrystalline semiconductor film on the portions of said source and drain regions which are exposed by said first and second contact holes, and on said insulating film;

forming a monocrystalline aluminum film on said monocrystalline semiconductor film;

removing the portions of said aluminum film in said first and second contact holes, thereby forming third and fourth contact holes which overlap said first and second contact holes, respectively;

forming tungsten films in said third and fourth contact holes; and patterning said monocrystalline semiconductor film and said monocrystalline aluminum film.

* * * * *